United States Patent [19]

Bae

[11] Patent Number: 5,577,005
[45] Date of Patent: Nov. 19, 1996

[54] CIRCUIT FOR USING CHIP INFORMATION

[75] Inventor: Jong Kon Bae, Seoul, Rep. of Korea

[73] Assignee: LG Semicon Co., Ltd., Choongchungbook, Rep. of Korea

[21] Appl. No.: 442,039

[22] Filed: May 16, 1995

[30] Foreign Application Priority Data

May 17, 1994 [KR] Rep. of Korea ......... 10842/1994

[51] Int. Cl.$^6$ ............... G11C 7/00; G11C 8/00
[52] U.S. Cl. ............... 365/233; 365/189.12
[58] Field of Search ............... 365/189.12, 230.01, 365/233, 240

[56] References Cited

U.S. PATENT DOCUMENTS

| 4,914,630 | 4/1990 | Fujishima et al. | 365/189.12 |
| 4,987,559 | 1/1991 | Miyauchi et al. | 365/189.12 |
| 5,260,905 | 11/1993 | Mori | 365/189.12 |
| 5,463,591 | 10/1995 | Aimoto et al. | 365/189.12 |
| 5,473,566 | 12/1995 | Rao | 365/189.12 |

Primary Examiner—David C. Nelms
Assistant Examiner—Trong Phan
Attorney, Agent, or Firm—Lowe, Price, LeBlanc & Becker

[57] ABSTRACT

A circuit for using chip information capable of using information stored in a target chip so that the target chip can be correctly controlled, which includes a control signal generator for a control signal in accordance with a chip selection signal, a read signal, a clock signal and an address signal, which are inputted from an externally connected element; a control information storing circuit for outputting a previously stored control information, which is needed for a control of the target chip, in accordance with a control signal outputted from the control signal generator; and an information converter for convening a control information outputted from the control information storing circuit and for outputting a convened information to an outside of the target chip.

7 Claims, 4 Drawing Sheets

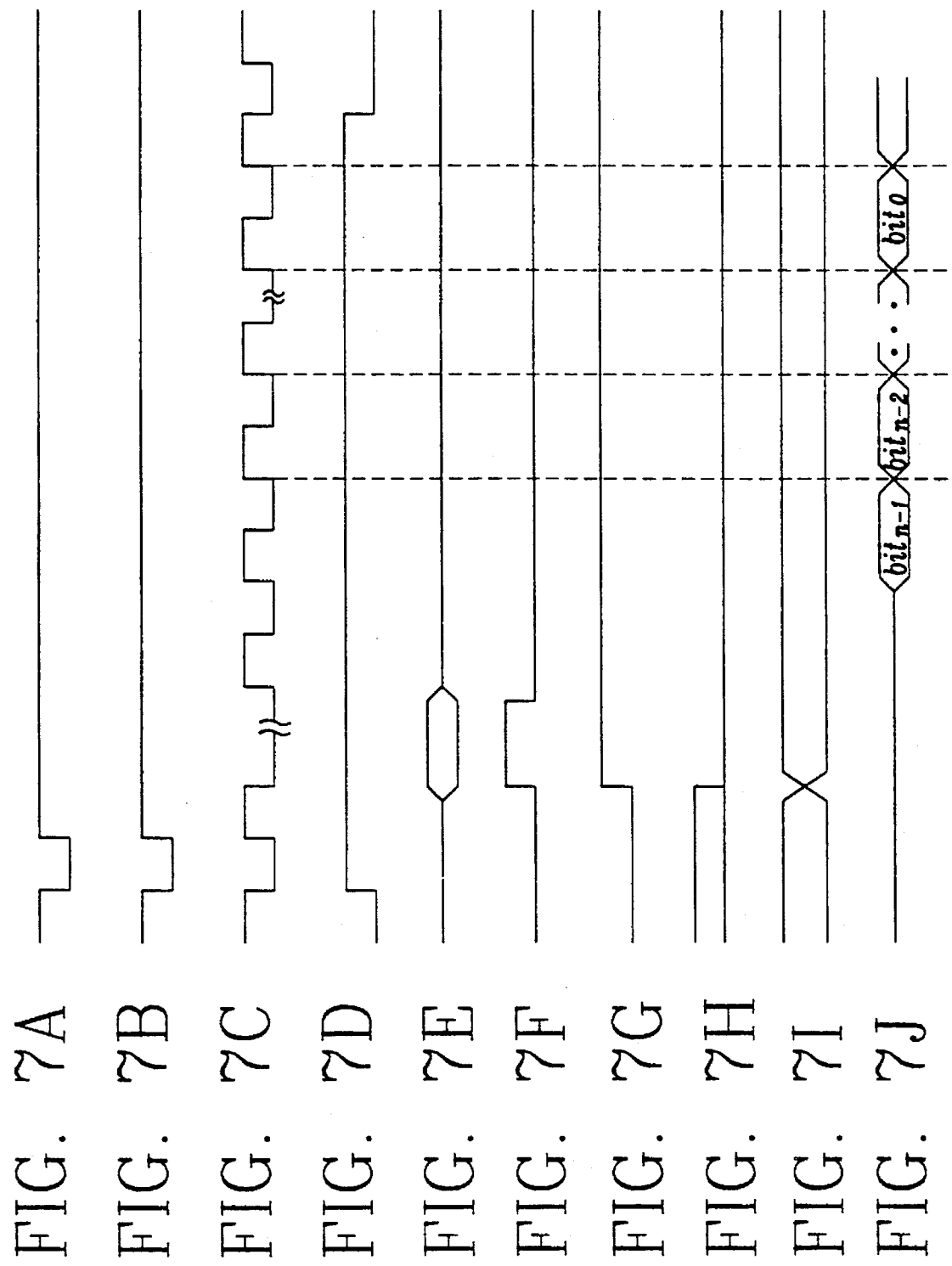

CIRCUIT FOR USING CHIP INFORMATION

BACKGROUND OF THE INVENTION

1. Field of the Invention

The present invention relates to a circuit for using chip information, and in particular to a circuit for using chip information capable of using information stored in a target chip so that the target chip can be correctly controlled.

2. Description of the Conventional Art

Conventionally, for controlling chip information, a controller is used. For example, when a user wants to use a DRAM with a 100 ns of an access time, the user inputs information related to the access time into a controller capable of controlling the DRAM chip. Thereafter, the controller controls the DRAM chip using the information stored therein. In addition, if a VGA chip is provided in a certain system, a user sets up information related to the VGA chip.

However, a controller can perform a control operation only within a range previously set by a user, so if a user wants to exchange the chip being used with a new one, the user must setup the chip information again, whereby it is inconvenient. In addition, due to the re-setup, malfunctions may happen.

SUMMARY OF THE INVENTION

Accordingly, it is an object of the present invention to provide a circuit for using chip information.

To achieve the above object, there is provided a circuit for using chip information, which includes a control signal generator for a control signal in accordance with a chip selection signal, a read signal, a clock signal and an address signal, which are inputted from an externally connected element; a control information storing circuit for outputting a previously stored control information, which is needed for a control of the target chip, in accordance with a control signal outputted from the control signal generator; and an information converter for convening a control information outputted from the control information storing circuit and for outputting a convened information to an outside of the target chip.

BRIEF DESCRIPTION OF THE DRAWINGS

FIG. 7A is a wave form of a chip selection signal of FIG. 1 according to the present invention.

FIG. 7B is a wave form of a read signal of FIG. 1 according to the present invention.

FIG. 7C is a wave form of a clock signal of FIG. 1 according to the present invention.

FIG. 7D is a wave form of an enable signal of FIG. 1 according to the present invention.

FIG. 7E is a wave form of a memory selection signal of FIG. 1 according to the present invention.

FIG. 7F is a wave form of an address signal using as a latch signal of FIG. 1 according to the present invention.

FIG. 7G is a wave form of a memory selection signal among memory selection signals of FIG. 1 according to the present invention.

FIG. 7H is a wave form of another memory selection signal among memory selection signals of FIG. 1 according to the present invention.

FIG. 7I is a wave form of a control information outputted from a control information storing circuit of FIG. 1.

FIG. 7J is a wave form of a control information outputted from an information converter of FIG. 1 according to the present invention.

DETAILED DESCRIPTION OF THE INVENTION

Figure 1:
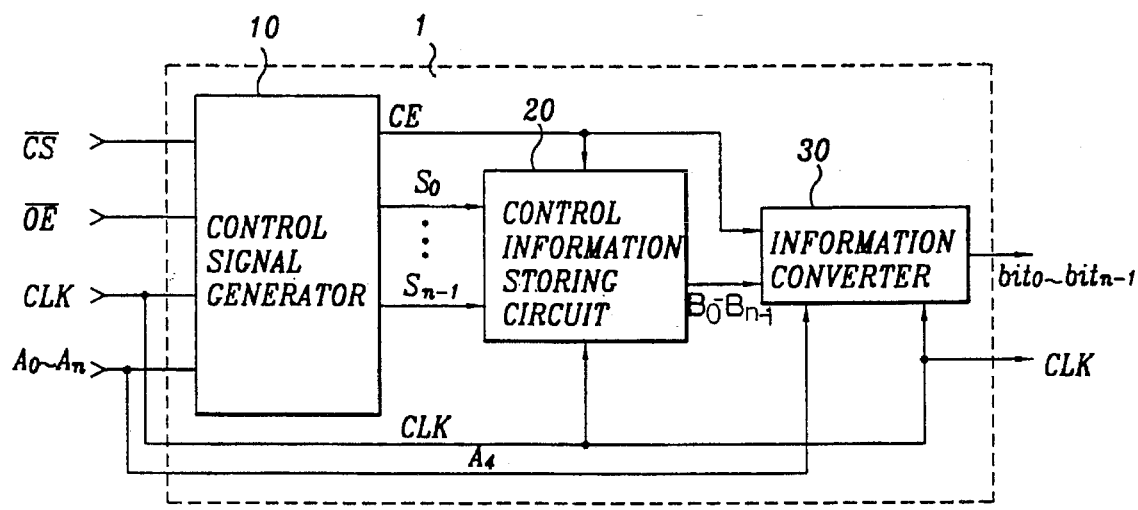
FIG. 1 is a block diagram of a circuit for using chip information according to the present invention.

Referring to FIG. 1, a circuit for using chip information according to the present invention is provided in a target chip 1 and provided with a control signal generator 10 for outputting an enable signal CE and a memory selection signal $S_0-S_{n-1}$ by inputting a chip selection signal /CS, a read signal /OE, a clock signal CLK, and an address signal $A_0-A_n$, which are outputted from an externally connected element, a control information storing circuit 20 for outputting a previously stored control information in accordance with an output signal of the control signal generator 10, and an information converter 30 for converting an enable signal CE outputted from the control signal generator 10 and a dock signal CLK and an address signal $A_4$, which are outputted from an externally connected element.

Figure 2:
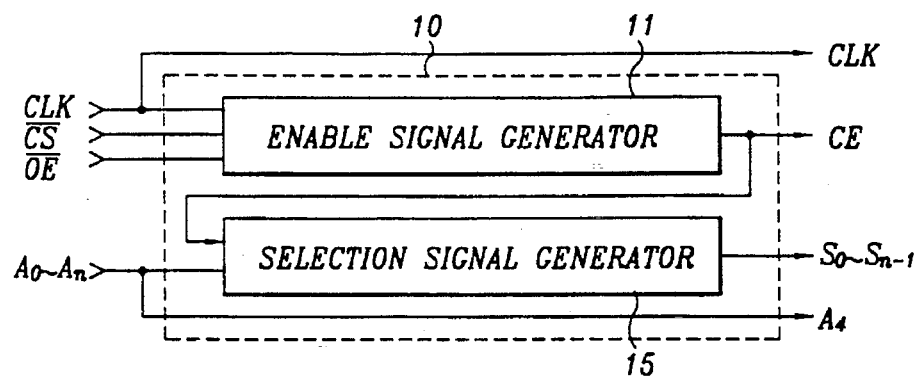
FIG. 2 is a block diagram of a control signal generator of FIG. 1 according to the present invention.

The control signal generator 10, as shown in FIG. 2, includes an enable signal generator 11 for receiving a chip selection signal /CS, a read signal /OE, and a clock signal CLK and for outputting an enable signal to the control information storing circuit 20, and a selection signal generator 15 for receiving an enable signal CE outputted from the enable signal generator 11 and an address signal $A_0-A_n$ outputted from an externally connected element and for outputting a memory selection signal $S_0-S_{n-1}$.

Figure 3A:
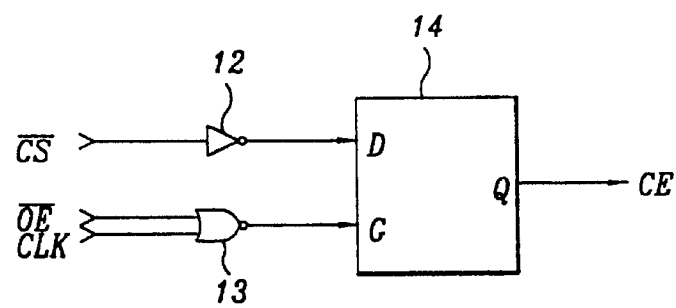
FIG. 3A is a schematic block diagram of an enable signal generator of FIG. 2 according to the present invention.

The enable signal generator 11, as shown in FIG. 3A, includes an inverter 12 for inverting a chip selection signal /CS outputted from an externally connected element, a NOR gate 13 for NORing a read signal /OE and a clock signal CLK which are outputted from an externally connected element, and a D flip-flop 14 for latching an output signal of the inverter in accordance with a NOR gate 13 and for outputting an enable signal CE to the selection signal generator 15, the control information storing circuit 20, and the information converter 30.

Figure 3B:
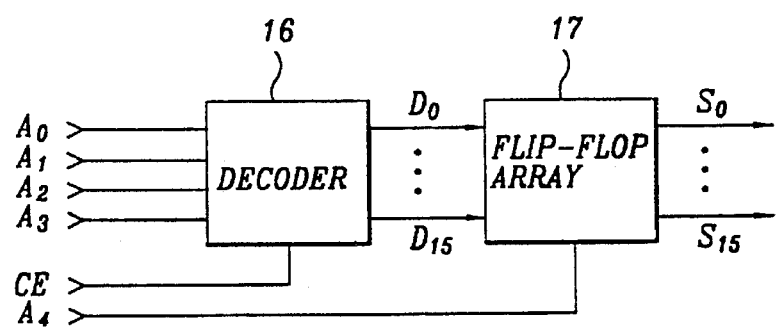
FIG. 3B is a schematic block diagram of a selection signal generator of FIG. 2 according to the present invention.

The selection signal generator 15, as shown in FIG. 3B, includes a decoder 16, enabled by an enable signal CE outputted from the enable signal generator 11, for decoding four address signals $A_0-A_3$ and for outputting decoding signals $D_0-D_{15}$ when assuming that five address signals $A_0-A_4$ are inputted from an externally connected element, and a flip-flop array 17 for latching the decoding signals $D_0-D_{15}$ in accordance with an address signal $A_4$ and for outputting memory selection signals $S_0-S_{15}$, each of which is corresponding to decoding signals $D_0-D_{15}$, respectively.

Here, the flip-flop array includes at least one flip-flop (not shown), each of which is corresponding to decoding signals $D_0$–$D_{15}$, respectively.

Figure 4:
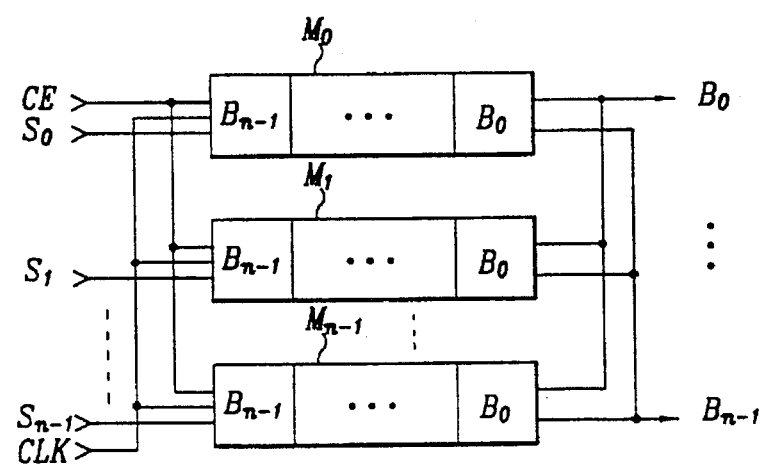
FIG. 4 is a schematic block diagram of a control information storing circuit of FIG. 1 according to the present invention.

The control information storing circuit 20, as shown in FIG. 4, includes 'n' information memories $M_0$–$M_{n-1}$, activated by an enable signal CE, for outputting 'n' bit control information $B_0$–$B_{n-1}$ in accordance with memory selection signals $S_0$–$S_{n-1}$.

Here, the flip-flop array includes a plurality of flip-flops (not shown) to be mated with the decoding signals $D_0$–$D_{15}$.

The control information storing circuit 20, as shown in FIG. 4, which is enabled by enable signals CE and activated by the clock signal CLK, and composed of 'n' information memories, is provided for outputting the control information of 'n' bit to the information converter 30 in accordance with a corresponding memory selection signal $S_0$–$S_{n-1}$.

Here, in the information memory $M_0$–$M_{n-1}$, the control information $B_0$–$B_{n-1}$ of 'n' bit is stored, in which each of output terminals thereof which is corresponding to each information memory $M_0$–$M_{n-1}$ is commonly connected.

Figure 5:
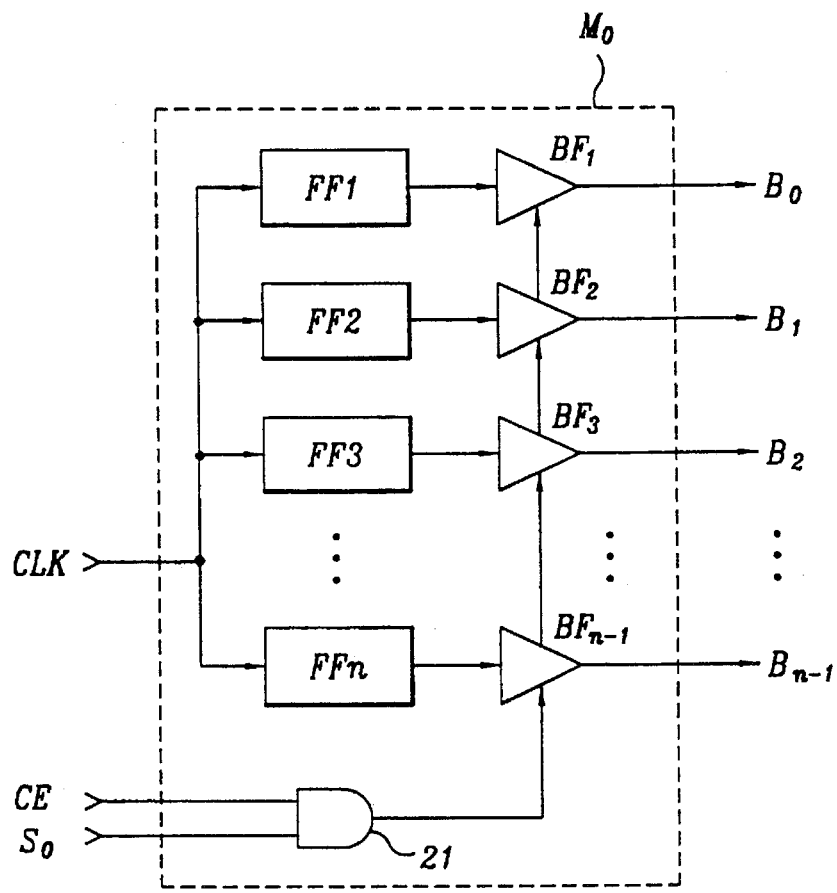
FIG. 5 is a schematic block diagram of an information memory of FIG. 4 according to the present invention.

Among the information memories $M_0$–$M_{n-1}$, the information memory $M_0$, as shown in FIG. 5, includes 'n' flip-flops $FF_1$–$FF_n$ to be activated in accordance with a clock signal CLK, an AND gate 21 for ANDing the enable signal CE and the memory selection signal $S_0$, and buffers $BF_1 BF_n$, enabled by an output signal of the AND gate 21, for controlling output of the flip-flops $FF_1$–$FF_n$. In addition, each of the remaining information memories $M_1$–$M_{n-1}$ includes the same elements as the information memory $M_0$.

Figure 6:
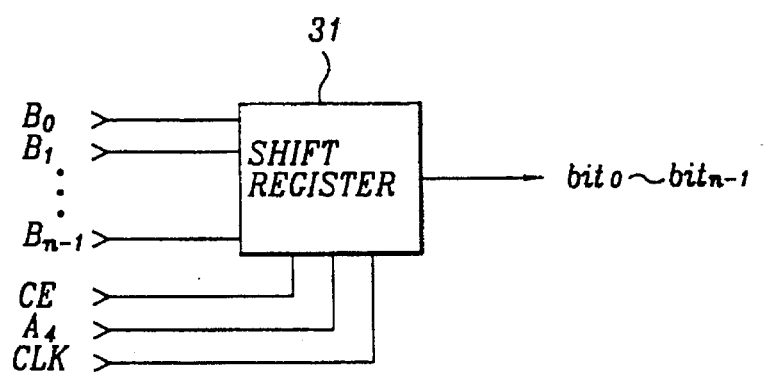
FIG. 6 is a schematic block diagram of an information converter of FIG. 1.

The information converter 30, as shown in FIG. 6, includes a shift register 31 provided for outputting the converted information to the outside element of the target chip 1 obtained by shifting the control information $B_0$–$B_{n-1}$ outputted from the control information storing circuit 20 in accordance with the enable signal CE, the address signal $A_4$ used as a latch signal, and a clock signal CLK.

The operation of a circuit for using a chip information according to the present invention will now be explained with reference to FIG. 7.

In the state that a target chip 1 is disposed in a system, a controller (not shown) provided for controlling the target chip 1 outputs a chip selection signal /CS, as shown in FIG. 7A, a read signal /OE, as shown in FIG. 7B, and a clock signal, as shown in FIG. 7C to the enable signal generator 11 of the control signal generating circuit 10.

Thereafter, the chip selection signal /CS is converted by an inverter 12. The inverted signal is applied to the data terminal D of the D flip-flop 14. The read signal /OE and the clock signal CLK are NORed by the NOR gate 13. The NORed signals are applied to the enable terminal G of the D flip-flop 14, so that an enable signal CE of a high level, as shown in FIG. 7F, is obtained.

Thereafter, the decoder 16 is enabled by an enable signal CE of a high level. For example, in case address signals $A_0$–$A_4$ of 5 bits are used, as shown in FIG. 7D, the address signals $A_0$–$A_3$ corresponding to where the stored control information are decoded, and the decoding signals $D_0$–$D_{15}$ are outputted to the flip-flop array 17, latched by an address signal $A_4$, and outputted to the information memories $M_0$–$M_{n-1}$ which are respectively corresponding to the memory selection signal $S_0$ as shown in FIG. 7G and the memory selection signal $S_1$–$S_{15}$ as shown in FIG. 7H.

That is, when the memory selection signal $S_0$ becomes a high level, the other memory selection signals $S_1$–$S_{15}$ become a low level, so that a corresponding information memory $M_0$ is selected by a memory selection signal $S_0$ of a high level.

Thereafter, the memory selection signal $S_0$ of a high level and the enable signal CE of a high level are ANDed the AND gate 21 of the information memory $M_0$ corresponding to the memory selection signal $S_0$. Thereafter, the buffers $BF_1$–$FF_n$ are enabled by the result of the above AND operation of a high level. The data outputted from the flip-flops $FF_1$–$FF_n$ activated by the clock signal CLK are buffered by the buffers $BF_1$–$BF_n$, and the control information $B_0$–$B_{n-1}$ are outputted to the shift register 31 of the information converter 30.

Thereafter, the shift register 31 enabled by an enable signal CE and synchronized by a clock signal CLK, as shown in FIG. 7J, converts the control information $B_0$–$B_{n-1}$ outputted from the information memory $M_0$ and outputs the converted control information $bit_0$–$bit_{n-1}$ to the outside of the target chip 1 along with the clock signal CLK.

That is, in case that the output of the shift register 31 is a serial type and control information $B_0$–$B_{n-1}$ outputted from the information memory $M_0$ are a parallel type of 'n' bit, the data of a parallel type is converted into a serial type data. In addition, in case that the output of a shift register 31 is a parallel type and the control information $B_0$–$B_{n-1}$ outputted from the information memory $M_0$ is a serial type of 'n' bit, the data of a serial type is converted to the type of a parallel data.

In addition, when the output of a shift register 31 is a parallel type of 'm' bit and the control information $B_0$–$B_{n-1}$ outputted from the information memory $M_0$ is a parallel type of 'n' bit that is, n>m(n=m*X+Y), the information converter 30 outputs 'X+1' m bit data.

As described above, the present invention is directed to provide a circuit for using chip information capable of using information stored in a target chip so that the target chip can be correctly controlled. In addition, the present invention is directed to provide a circuit for using chip information capable of controlling the information stored in a target chip, so that, when the target chip is replaced with a new one, there is no need to re-setup the previously stored control information, and thus the present invention can prevent malfunctions which may be caused by an erroneous setup of control information of a target chip.

What is claimed is:

1. A circuit in a target chip for using chip information, comprising:

a control signal generator for outputting a control signal in accordance with a chip selection signal, a read signal, a clock signal and an address signal, which are inputted from an externally connected element;

a control information storing circuit for outputting a previously stored control information, which is needed to control said target chip, in accordance with a control outputted from said control signal generator; and an information converter for converting the control information outputted from the control information storing circuit and for outputting the converted control information to outside of the target chip.

2. The circuit of claim 1, wherein said control signal generator includes;

an enable signal generator for logically operating the chip selection signal, the read signal, and the clock signal and for latching a logically operated signal and for outputting a latched enable signal to the control information storing circuit and the information converter; and a selection signal generator, enabled by the latched enable signal outputted from said enable signal generator, for outputting a memory selection signal corresponding to the address signal to the information converter.

3. The circuit of claim 2, wherein said enable signal generator includes;

an inverter for inverting the chip selection signal;

a NOR gate for NORing the read signal and the clock signal; and a D flip-flop, enabled by the logically operated signal outputted from said NOR gate, for latching an output signal of the inverter and for outputting the latched enable signal to the selection signal generator, the control information storing circuit, and the information converter, respectively.

4. The circuit of claim 2, wherein said selection signal generator includes;

a decoder, activated by the enable signal output from the enable signal generator, for decoding an address signal; and a flip-flop array for latching an output signal of said decoder and for outputting a latched memory selection signal to the control information storing circuit.

5. The circuit of claim 1, wherein said control information storing circuit includes at least one information memory provided for outputting a previously stored control information to the information converter in accordance with a memory selection signal, the latched enable signal, and a clock signal.

6. The circuit of claim 5, wherein said information memory includes;

at least one flip-flop, activated by the clock signal, for outputting the previously stored information;

an AND gate for ANDing the latched enable signal and the latched memory selection signal; and at least one buffer, enabled by an output signal of said AND gate, for buffering an information outputted from said flip-flop and for outputting an buffered control information to the information converter.

7. The circuit of claim 1, wherein said information converter includes a shift register, enabled by the latched enable signal, provided for shifting a control information outputted from the information storing circuit and for outputting a shifted information signal to an outside of the target chip.

* * * * *